(12) United States Patent
Hsu et al.

(10) Patent No.: US 11,908,953 B2
(45) Date of Patent: Feb. 20, 2024

(54) MANUFACTURING METHOD OF MEMORY DEVICE

(71) Applicant: Winbond Electronics Corp., Taichung (TW)

(72) Inventors: Che-Jui Hsu, Taichung (TW); Ying-Fu Tung, Taichung (TW); Chun-Sheng Lu, Taichung (TW); Kuo-Feng Huang, Taichung (TW); Yu-Chi Kuo, Taichung (TW); Wang-Ta Li, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 18/081,703

(22) Filed: Dec. 15, 2022

(65) Prior Publication Data

US 2023/0121256 A1    Apr. 20, 2023

Related U.S. Application Data

(62) Division of application No. 16/999,022, filed on Aug. 20, 2020, now Pat. No. 11,575,051.

(30) Foreign Application Priority Data

Aug. 30, 2019 (TW) ................................. 108131162

(51) Int. Cl.
*H01L 29/788* (2006.01)
*H01L 21/26* (2006.01)
(Continued)

(52) U.S. Cl.
CPC ...... *H01L 29/788* (2013.01); *H01L 29/66825* (2013.01); *H10B 41/35* (2023.02)

(58) Field of Classification Search
None
See application file for complete search history.

(56) References Cited

U.S. PATENT DOCUMENTS

2003/0011017 A1    1/2003  Lee et al.
2003/0107104 A1*   6/2003  Wu ................. H01L 21/823864
                                              257/E21.64
(Continued)

FOREIGN PATENT DOCUMENTS

CN      104377202        2/2015
KR      20080030249      4/2008

OTHER PUBLICATIONS

"Office Action of China Counterpart Application", dated May 23, 2023, p. 1-p. 7.

*Primary Examiner* — Xiaoming Liu
(74) *Attorney, Agent, or Firm* — JCIPRNET

(57) ABSTRACT

A manufacturing method of a memory device are provided. The method includes following steps. A gate stacking structure is formed over a substrate. A first insulating layer, a second insulating layer and a mask material layer are sequentially formed over the substrate to cover the gate stacking structure. An ion implantation process is performed on the mask material layer to form a doped portion in the mask material layer. The doped portion caps on a top portion of the gate stacking structure. A first patterning process is performed on the mask material layer using the doped portion as a shadow mask to remove a bottom portion of the mask material layer extending along a surface of the substrate. A second patterning process is performed to remove the doped portion of the mask material layer and an exposed bottom portion of the second insulating layer surrounding the gate stacking structure.

14 Claims, 13 Drawing Sheets

(51) Int. Cl.
  *H01L 29/66*  (2006.01)
  *H10B 41/35*  (2023.01)

(56) References Cited

U.S. PATENT DOCUMENTS

2008/0142879 A1* 6/2008 Chong .................. H01L 29/665
                                                              257/327
2019/0244967 A1* 8/2019 Lee ........................ H01L 29/518

* cited by examiner

MANUFACTURING METHOD OF MEMORY DEVICE

CROSS-REFERENCE TO RELATED APPLICATION

This application is a divisional application of and claims the priority benefit of U.S. application Ser. No. 16/999,022, filed on Aug. 20, 2020, which claims the priority benefit of Taiwan application serial no. 108131162, filed on Aug. 30, 2019. The entirety of each of the above-mentioned patent applications is hereby incorporated by reference herein and made a part of this specification.

BACKGROUND

Technical Field

The present disclosure relates to a manufacturing method of a memory device, and particularly, to a manufacturing method of a non-volatile memory.

Description of Related Art

Flash memory device is a type of a non-volatile memory device, and has become one of the main storage media in recent years. However, some charged ions would be inevitably produced during manufacturing process of the flash memory device. These charged ions may penetrate into a gate structure of the flash memory device, and have influence on operation of the flash memory. As a result, reliability of the flash memory may be compromised.

SUMMARY

Accordingly, a flash memory having improved reliability and a manufacturing method thereof are provided.

A manufacturing method of a memory device according to embodiments of the present disclosure comprises: forming a gate stacking structure over a substrate; sequentially forming a first insulating layer, a second insulating layer and a mask material layer over the substrate to cover the gate stacking structure; performing an ion implantation process on the mask material layer, to form a doped portion in the mask material layer, wherein the doped portion caps on a top portion of the gate stacking structure; performing a first patterning process on the mask material layer by using the doped portion as a shadow mask, to remove a bottom portion of the mask material layer extending along a surface of the substrate; and performing a second patterning process to remove the doped portion of the mask material layer and an exposed bottom portion of the second insulating layer surrounding the gate stacking structure, wherein a remained portion of the mask material layer forms a first spacer.

The memory device according to embodiments of the present disclosure includes a gate stacking structure disposed over a substrate, and includes a first insulating layer, a second insulating layer and a first spacer covering the gate stacking structure. A top surface and a sidewall of the gate stacking structure are covered by the first insulating layer, and the first insulating layer is covered by the second insulating layer. The first spacer covers the second insulating layer, and is located on a sidewall of the gate stacking structure. In addition, the topmost end of the first spacer is lower than the topmost surface of the second insulating layer. Particularly, a top corner region of the gate stacking structure is covered by the first insulating layer and the second insulating layer, such that the charged ions generated during manufacturing process can be blocked from entering the gate stacking structure. Therefore, a reliability of the memory device can be improved.

To make the aforementioned more comprehensible, several embodiments accompanied with drawings are described in detail as follows.

BRIEF DESCRIPTION OF THE DRAWINGS

FIG. 2A through FIG. 2K are cross-sectional views illustrating structures at various stages during the manufacturing method of the memory device as shown in FIG. 1.

DESCRIPTION OF THE EMBODIMENTS

Figure 1:
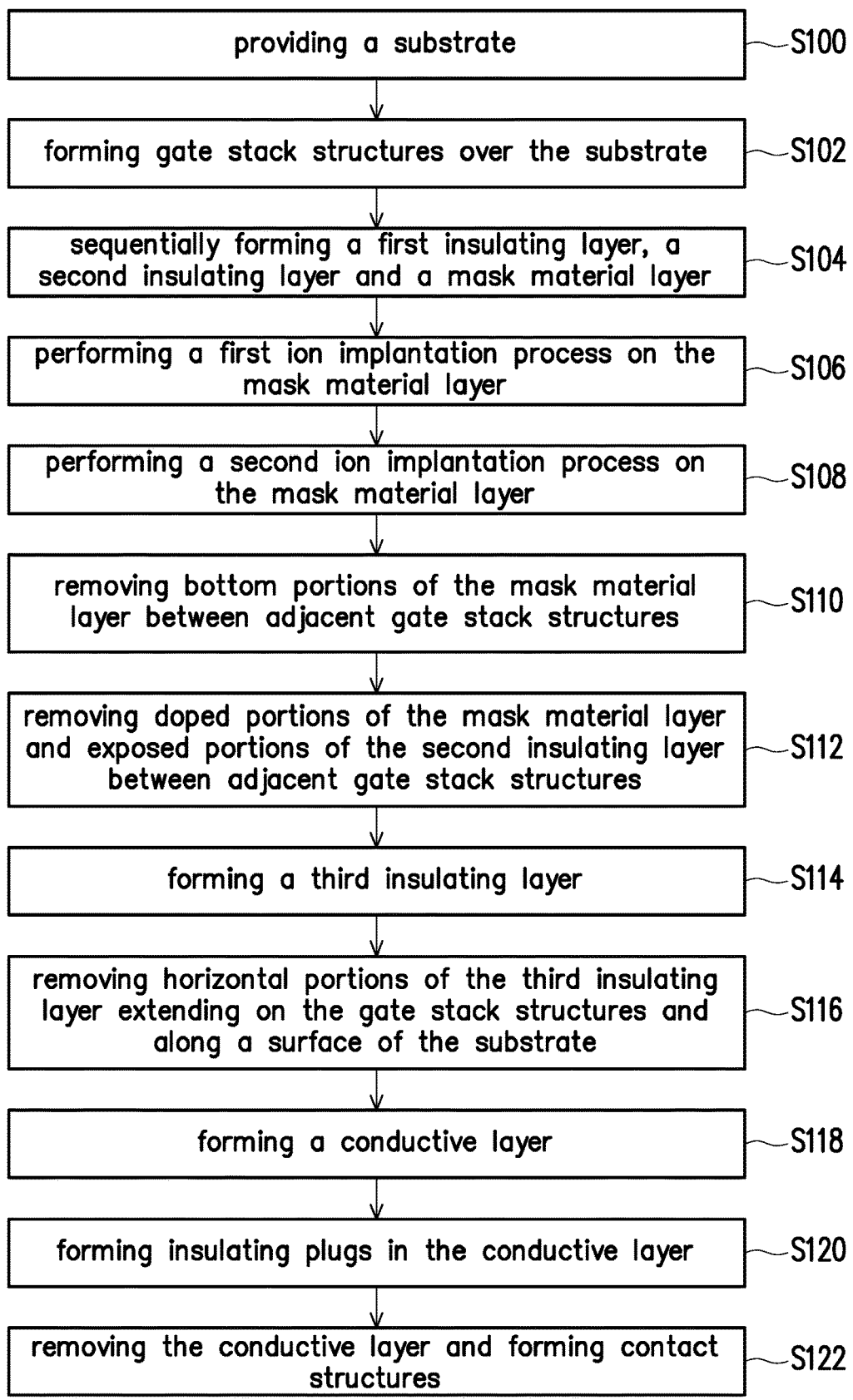
FIG. 1 is a process flow diagram illustrating a manufacturing method of a memory device according to some embodiments of the present disclosure.
Figure 2A:
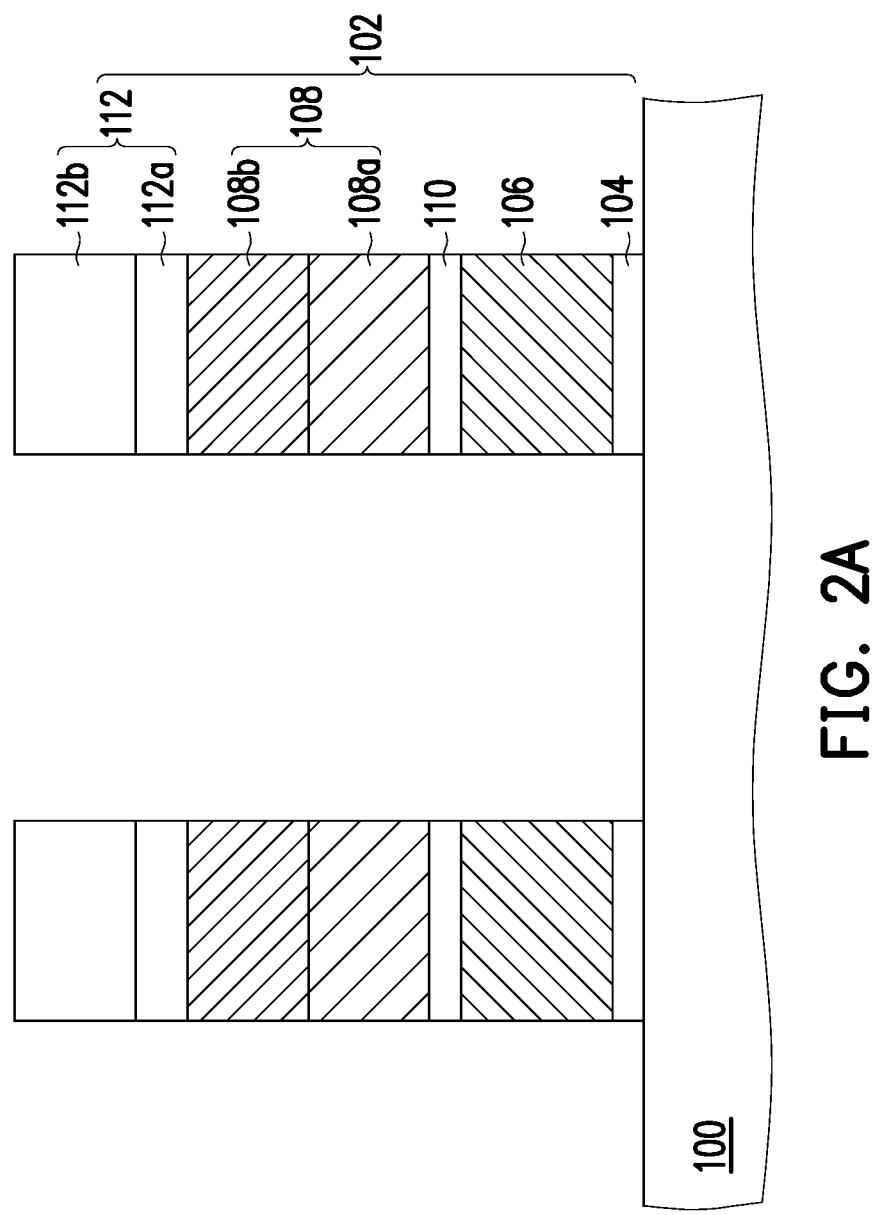

Referring to FIG. 1 and FIG. 2A, step S100 is performed, and a substrate 100 is provided. Thereafter, step S102 is performed, and gate stacking structures 102 are formed over the substrate 100. Each of the gate stacking structures 102 includes a tunneling dielectric layer 104, a first gate electrode 106, a second gate electrode 108 and an inter-gate dielectric layer 110. In the present embodiment, the tunneling dielectric layer 104, the first gate electrode 106, the inter-gate dielectric layer 110 and the second gate 108 are sequentially stacked over the substrate 100. In some embodiments, a material of the tunneling dielectric layer 104 may be silicon oxide, silicon carbide or other dielectric materials containing group IV element(s). The first gate electrode 106 may be functioned as a floating gate, and a material of the first gate electrode 106 is such as polysilicon. In some embodiments, the inter-gate dielectric layer 100 may be a multilayer structure. This multilayer structure may include two types of dielectric material layers alternately stacked on one another. For instance, the inter-gate dielectric layer 110 may be a silicon oxide-silicon nitride-silicon oxide (ONO) multilayer structure. In some embodiments, the second gate electrode 108 includes multiple layers. For instance, the second gate electrode 108 may include a gate electrode layer 108a and a gate electrode layer 108b over the gate electrode layer 108a. The gate electrode layer 108a and the gate electrode layer 108b may respectively be made of a conductive material. Initially, the tunneling dielectric layer 104, the first gate electrode 106, the inter-gate dielectric layer 110 and the second gate electrode 108 may be globally formed on the substrate 100. Thereafter, these globally covered tunneling dielectric layer 104, first gate electrode 106, inter-gate dielectric layer 110 and second gate electrode 108 are patterned, so as to form the gate stacking structures 102 as shown in FIG. 2A. In some embodiments, a method for forming the tunneling dielectric layer 104, the first gate electrode 106, the second gate electrode 108 and the inter-gate dielectric layer 110 may include a chemical vapor deposition (CVD) process, a plating process, the like or combinations thereof. In some embodiments, the first gate electrode 106 and the second gate electrode 108 may be doped with group III or group V element(s).

In addition, in some embodiments, each gate stacking structure 102 may further include a capping structure 112 disposed over the second gate electrode 108. The capping structure 112 may include a capping layer 112a and a capping layer 112b over the capping layer 112a. In some embodiments, materials of the capping layer 112a and the capping layer 112b may include silicon nitride or silicon oxide, and a formation method of the capping layers 112a and 112b may include a CVD process. In addition, during formation of the gate stacking structures 102, the capping layers 112b of the capping structures 112 may be used as hard mask structures in an etching process. A method for forming the gate stacking structures 102 may include a lithography process and at least two etching processes. In one of the gate stacking structures 102, a sidewall of the capping structure 112 may be substantially coplanar with sidewalls of the second gate electrode 108, the inter-gate dielectric layer 110, the first gate electrode 106 and the tunneling dielectric layer 104.

Figure 2B:
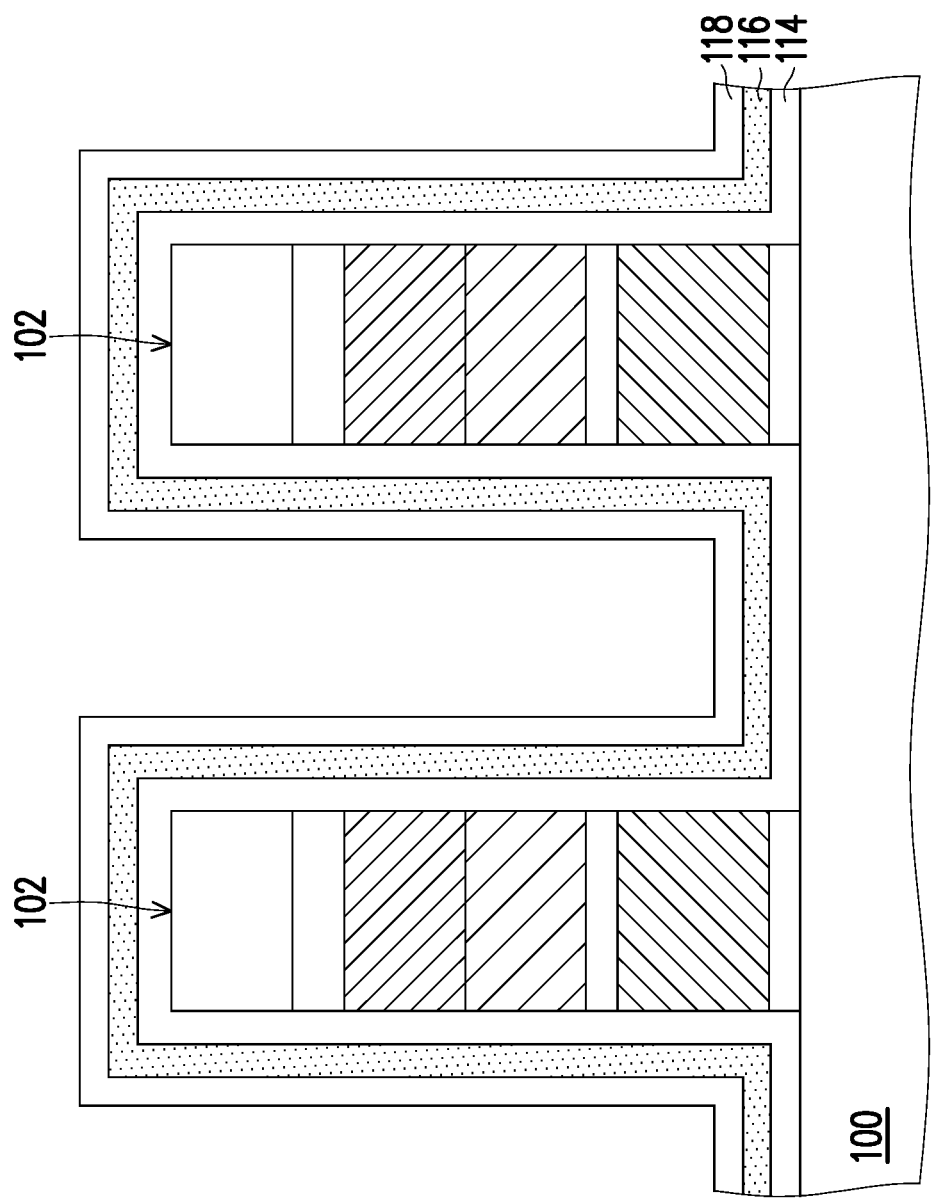

Referring to FIG. 1, FIG. 2A and FIG. 2B, step S104 is performed, and a first insulating layer 114, a second insulating layer 116 and a mask material layer 118 are sequentially formed, to globally cover the structure shown in FIG. 2A. The first insulating layer 114, the second insulating layer 116 and the mask material layer 118 conformally cover the structure shown in FIG. 2A. In other words, top surfaces and sidewalls of the gate stacking structures 102 and portions of the substrate 100 not overlapped with the gate stacking structures 102 are covered by the first insulating layer 114, the second insulating layer 116 and the mask material layer 118. In some embodiments, the first insulating layer 114 and the mask material layer 118 may be formed of a first material, whereas the second insulating layer 116 may be formed of a second material having an etching selectivity with respect to the first material. For instance, the first material may be silicon oxide, whereas the second material may be silicon nitride. Moreover, in some embodiments, the first insulating layer 114, the second insulating layer 116 and the mask material layer 118 may respectively be formed by a CVD process.

Figure 2C:
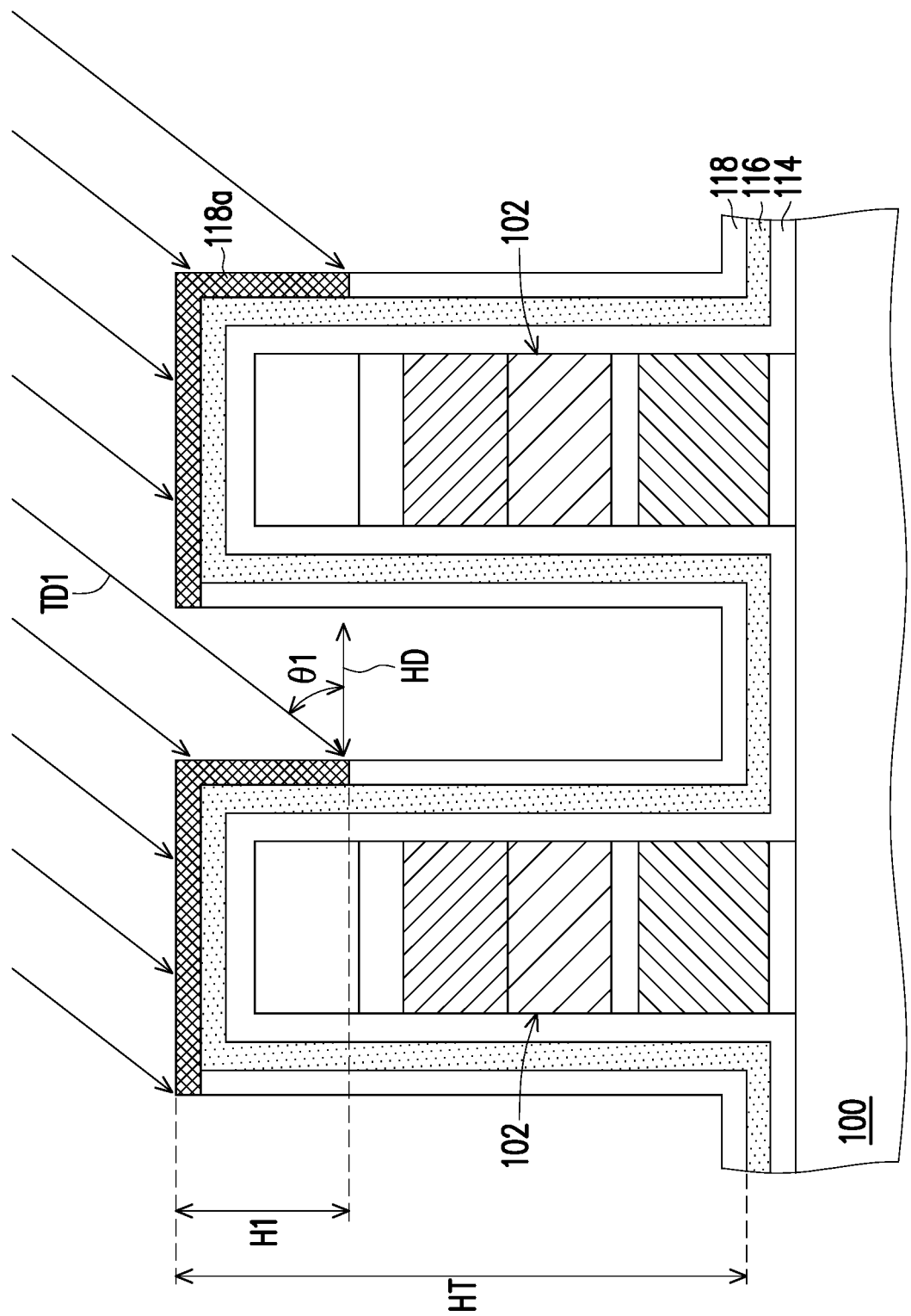

Referring to FIG. 1, FIG. 2B and FIG. 2C, step S106 is performed, and a first ion implantation process is performed on the mask material layer 118. The first ion implantation process may be an oblique ion implantation process. During the first ion implantation process, dopants strike the mask material layer 118 along an oblique incident direction TD1 from a side of each gate stacking structure 102. For instance, an angle θ1 between the oblique incident direction TD1 and a horizontal direction HD may be less than 90°, such as ranging from 1° to 45°. In this way, first portions 118a of the mask material layer 118, which are not being shielded, are doped, whereas a composition of the remainder portion of the mask material layer 118 remain unchanged (undoped). For instance, the undoped portions of the mask material layer 118 may be made of silicon oxide, whereas the first portions 118a of the mask material layer 118 may be doped with nitrogen-containing dopants to form silicon oxynitride or silicon nitride. The nitrogen-containing dopants may include $Si_3N_4$, silicon oxynitride or other materials having sufficient etching selectivity with respect to the undoped portions of the mask material layer 118. In some embodiments, the first portions 118a of the mask material layer 118 may include top regions over the gate stacking structures 102, and include vertical regions respectively located at a side of each gate stacking structure 102. The vertical regions extend downwardly from the top regions, but do not reach bottom portions of the mask material layer 118. As such, the top surface and an upper part of a sidewall of each gate stacking structure 102 are covered by the corresponding doped first portion 118a of the mask material layer 118, whereas an lower part of the sidewall of each gate stacking structure 102 is covered by the corresponding undoped portion of the mask material layer 118. In some embodiments, a ratio of a height H1 of the first portions 118a of the mask material layer 118 with respect to a total height HT of the mask material layer 118 may range from 1:3 to 1:10, and the height H1 of the first portions 118a may be equal to or greater than 110 nm.

Figure 2D:
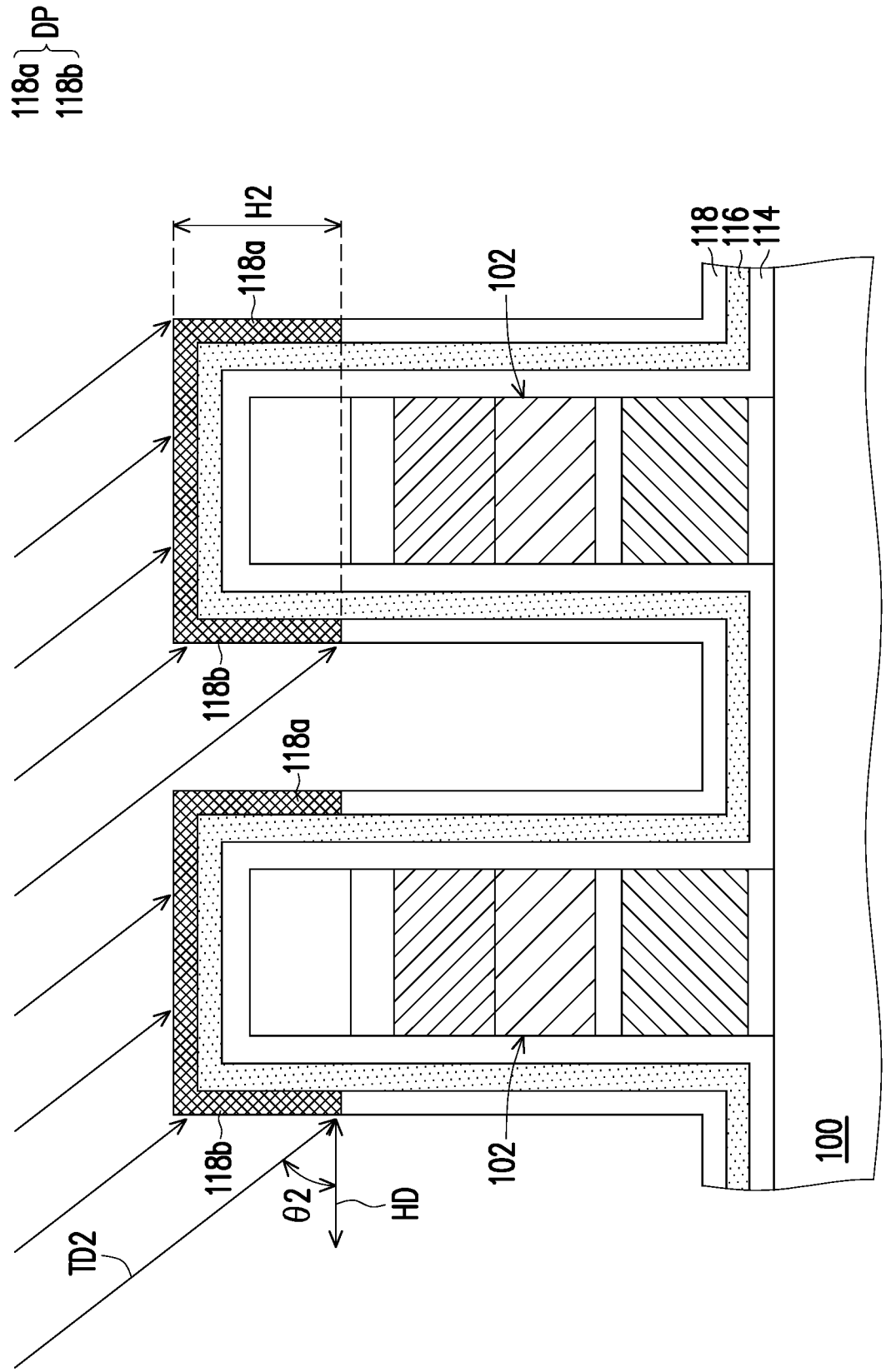

Referring to FIG. 1, FIG. 2C and FIG. 2D, step S108 is performed, and a second ion implantation process is performed on the mask material layer 118. The first ion implantation process and the second ion implantation process may both be oblique ion implantation processes, and may use the same dopant. During the second ion implantation process, dopants strike the mask material layer 118 along an oblique incident direction TD2 from a side of each gate stacking structure 102. For instance, an angle θ2 between the oblique incident direction TD2 and the horizontal direction HD may be less than 90°, such as ranging from 1° to 45°. In some embodiments, the angle θ1 (as shown in FIG. 2C) may be substantially equal to the angle θ2 (as shown in FIG. 2D), and the oblique incident direction TD1 (as shown in FIG. 2C) and the oblique incident direction TD2 (as shown in FIG. 2D) may be in mirror symmetry with respect to a vertical direction. During the second ion implantation process, second portions 118b of the mask material layer 118, which are not being shielded, are doped. In some embodiments, the second portions 118b of the mask material layer 118 may include top regions over the gate stacking structures 102, and include vertical regions respectively located at a side of each gate stacking structure 102. The vertical regions extend downwardly from the top regions, but do not reach the bottom portions of the mask material layer 118. In some embodiments, the second portions 118b formed in the second ion implantation process are partially overlapped with the first portions 118a formed in the first ion implantation process. For instance, the top regions of the first portions 118a may be at least partially overlapped with the top regions of the second portions 118b. As such, these overlapped regions are doped multiple times, and may have a higher doping concentration. On the other hand, the vertical regions of the first portions 118a and the vertical regions of the second portions 118b may partially cover the sidewalls of the gate stacking structure 102 at opposite sides of the gate stacking structures 102. In some embodiments, a height H2 of the second portions 118b of the mask material layer 118 may be substantially equal to the height H1 of the first portions 118a of the mask material layer 118.

In some embodiments, after completion of the first and second ion implantation processes, a decoupled plasma nitridation (DPN) treatment is performed on the doped portions of the mask material layer 118, such that the dopants implanted into the first and second portions 118a and 118b of the mask material layer 118 can react with the material of the mask material layer 118. In this way, the first and second portions 118a and 118b of the mask material layer 118 can be modified, and the first and second portions 118a and 118b of the mask material layer 118 can have a sufficient etching selectivity with respect to the remainder portion of the mask material layer 118. In some embodiments, surface regions of the first and second portions 118a and 118b of the mask material layer 118 are modified to form a nitride layer. In addition, in some embodiments, the DPN treatment includes heating the wafer in a nitrogen atmosphere. A process time of this heat treatment may be less than or equal to about 24 hours. Furthermore, in some embodiments, a queue time between the stop of ion implantation processes and the stop of heat treatment is no more than 24 hours. The wafer may be stored or delivered during the queue time. In some embodiments, during the queue time, the wafer may be disposed in an atmosphere having positive pressure and being rich in nitrogen gas or inert gas (e.g., Ar gas). As such, a shelf life of the wafer can be extended.

Hereinafter, the first portions 118a and the second portions 118b are collectively referred as doped portions DP. Each doped portion DP has a cap-like shape, and caps on a top portion of the corresponding gate stacking structure 102. A composition of the doped portions DP is different from a composition of the remainder portion of the mask material layer 118, thus the doped portions DP have an etching selectivity with respect to the remainder portion of the mask material layer 118. In this way, the doped portions DP may be functioned as shadow masks during a subsequent etching process performed on the mask material layer 118.

Figure 2E:
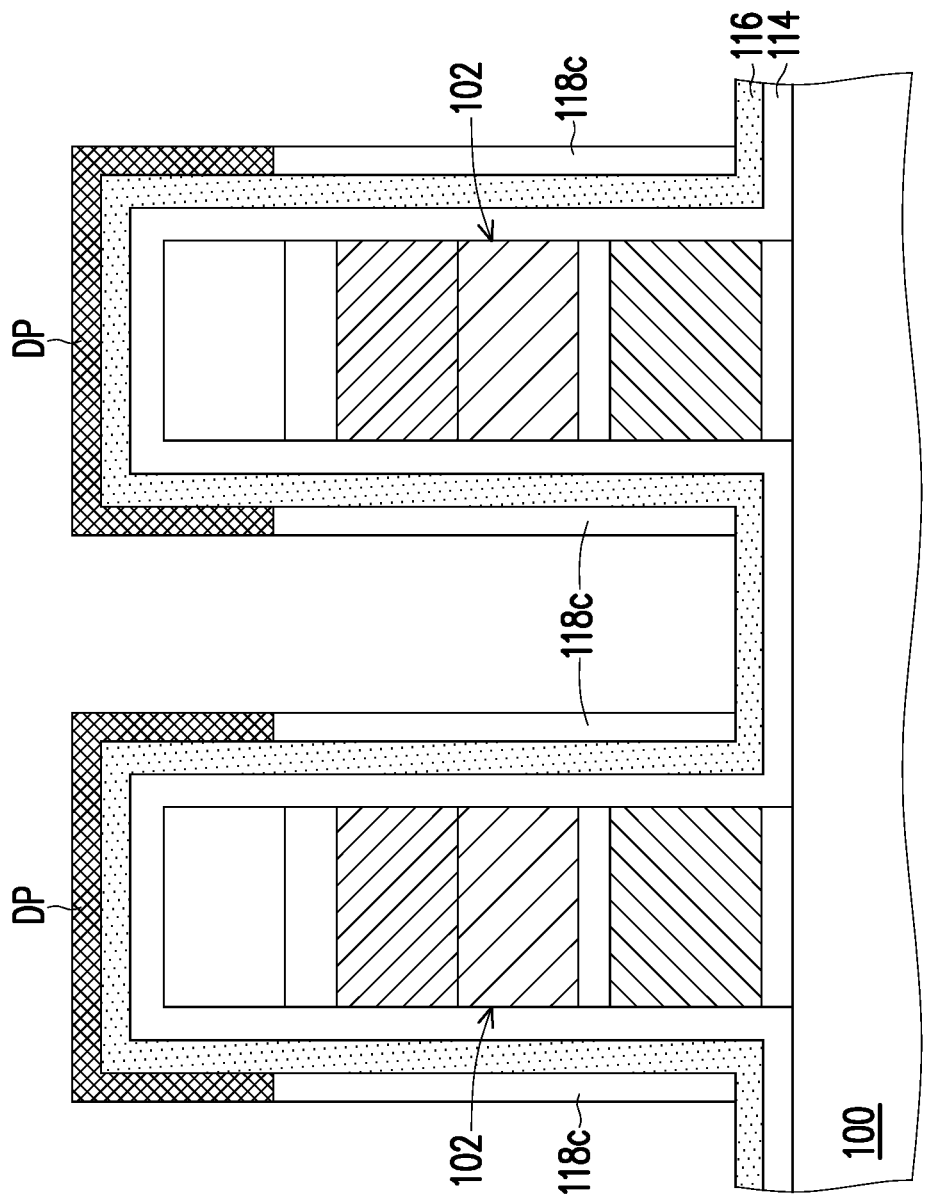

Referring to FIG. 1, FIG. 2D and FIG. 2E, step S110 is performed, and bottom portions of the mask material layer 118 located between adjacent gate stacking structures 102 are removed. In some embodiments, the step S110 may be performed by an anisotropic etching process. During this anisotropic etching process, certain regions of the undoped portions of the mask material layer 118 are selectively removed by using the doped portions DP of the mask material layer 118 as shadow masks. As shown in FIG. 2D, the undoped portions of the mask material layer 118 includes vertical regions extending along sidewalls of the gate stacking structures 102, and includes bottom regions located between adjacent vertical regions. The vertical regions of the undoped portions are shielded by the shadow masks (i.e., the doped portions DP), whereas the bottom regions of the undoped portions are not shielded by the shadow masks (i.e., the doped portions DP). Accordingly, when the anisotropic etching process is performed by using the doped portions DP as shadow masks (as shown in FIG. 2E), the bottom regions of the undoped portions would be removed, whereas the vertical regions of the undoped portions would remain. In this way, removal of certain regions of the undoped portions of the mask material layer 118 can be regarded as self-aligning, and an additional lithography process for defining the to-be-removed regions of the undoped portions is not required. Hereinafter, the remained regions (i.e., the vertical regions) of the undoped portions of the mask material layer 118 are referred as first spacers 118c. In addition, after removing the bottom regions of the undoped portions of the mask material layer 118, the underlying second insulating layer 116 is partially exposed.

Figure 2F:
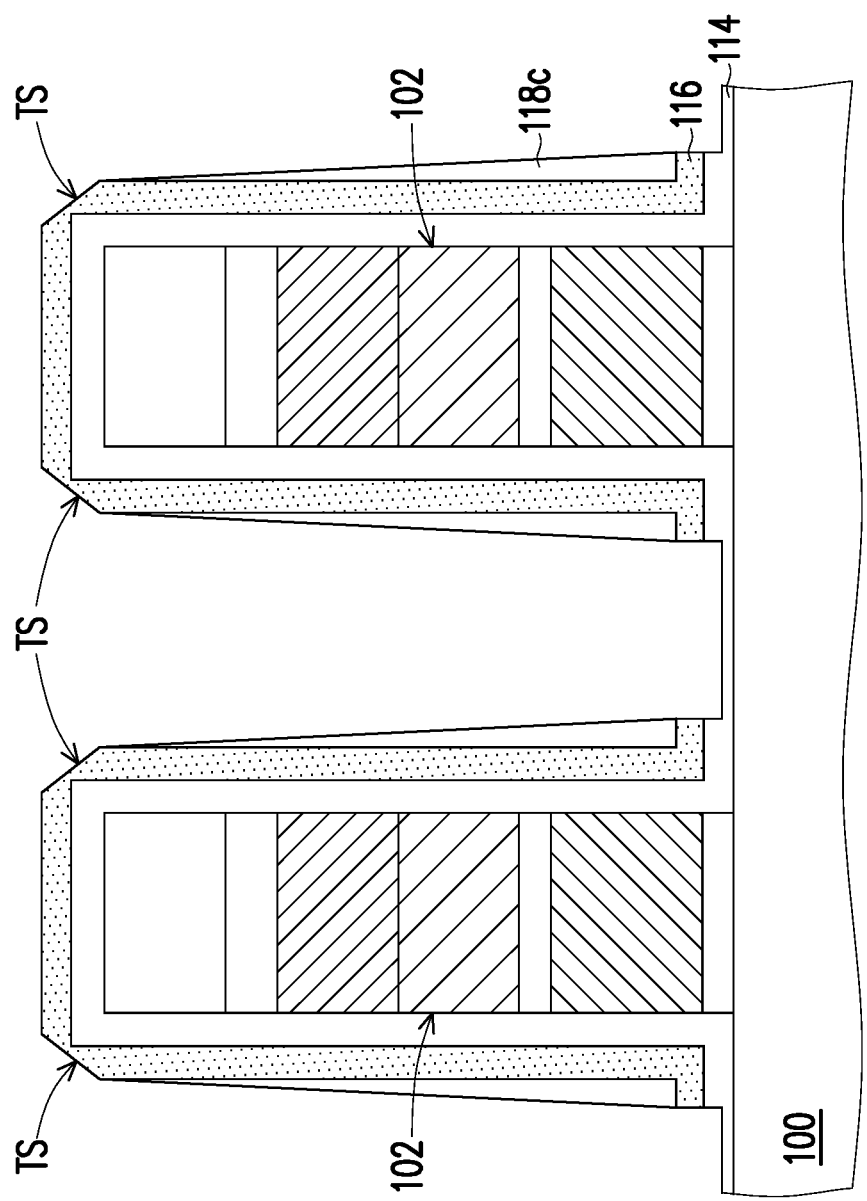

Referring to FIG. 1, FIG. 2E and FIG. 2F, step S112 is performed, and the doped portions DP of the mask material layer 118 and the exposed portions of the second insulating layer 116 between adjacent gat stacking structures 102 (as shown in FIG. 2E) are removed. In some embodiments, the step S112 may be performed by an anisotropic etching process. In addition, in some embodiments, the doped portions DP of the mask material layer 118 are made of silicon oxynitride or silicon nitride, and an etching rate of the doped portions DP approximates or substantially equals to an etching rate of the second insulating layer 116, which is made of silicon nitride. On the other hand, the undoped portions of the mask material layer 118 (i.e., the first spacers 118c) and the first insulating layer 114 may be made of silicon oxide, and has an etching selectivity with respect to the doped portions DP of the mask material layer 118 and the second insulating layer 116. Accordingly, the doped portions DP of the mask material layer 118 and the exposed portions of the second insulating layer 116 (as shown in FIG. 2E) can be selectively removed during the anisotropic etching process, and such anisotropic etching process may stop when portions of the first insulating layer 114 located between adjacent first spacers 118c are exposed. In some embodiments, a thickness of the mask material layer 118 (as shown in FIG. 2C) is substantially equal to or greater than a thickness of the second insulating layer 116. For instance, a ratio of the thickness of the second insulating layer 116 with respect to the thickness of the mask material layer 118 may range from 1 to 1.25. In these embodiments, after completely removing the doped portions DP of the mask material layer 118 and the bottom portions of the second insulating layer 116 located between adjacent first spacers 118c, top portions of the second insulating layer 116 used to be covered by the doped portions DP may be at least partially remained. Therefore, after completion of the step S112, a top portion of each gate stacking structure 102 can be completely capped by the first insulating layer 114 and the second insulating layer 116.

In some embodiments, the top portions of the second insulating layer 116 capping the gate stacking structures 102 may be partially removed during the step S112. For instance, top corner regions of the second insulating layer 116 may be removed, so as to form inclined surfaces TS. In addition, in some embodiments, the first spacers 118c may be partially removed during the step S112. For instance, before performing the step S112 (as shown in FIG. 2E), the first spacers 118c covers the sidewalls of the gate stacking structures 102, and may be functioned as isolation walls. The first spacers 118c may be partially removed to form wedge shape structures during the step S112. As shown in FIG. 2F, a top portion of the first spacer 118c may have a width smaller than a width of a bottom portion of the first spacer 118c, and an exposed surface of the first spacer 118c may substantially be an inclined surface or a curved surface. On the other hand, portions of the first insulating layer 114 and the second insulating layer 116 covered by the first spacers 118c respectively appear to be an L-shape. Furthermore, in some embodiments, bottom portions of the first insulating layer 114 located between adjacent first spacers 118c may be partially removed during the step S112. In these embodiments, these bottom portions of the first insulating layer 114 may have a thickness less than a thickness of the remainder portion of the first insulating layer 114.

Figure 2G:
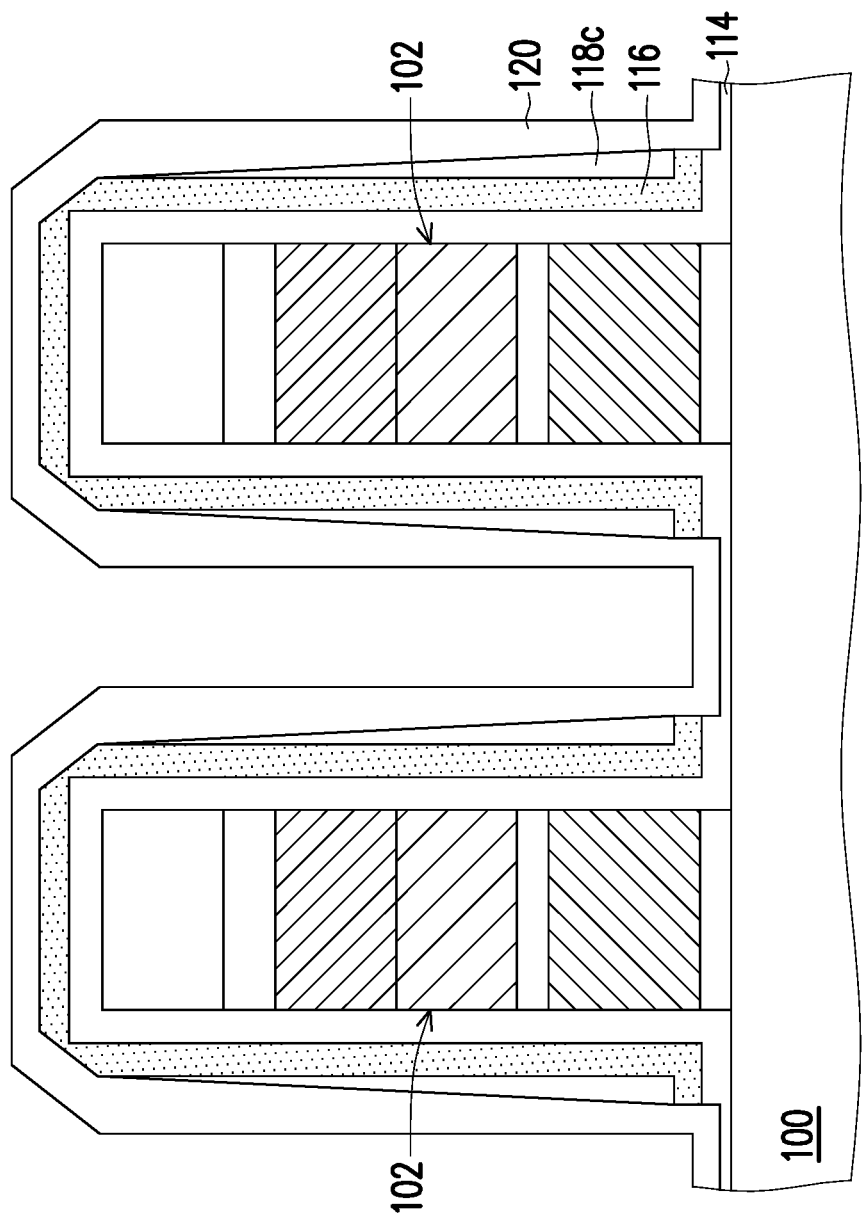

Referring to FIG. 1, FIG. 2F and FIG. 2G, step S114 is performed, and a third insulating layer 120 is formed. In some embodiments, the structure shown in FIG. 2F is globally and conformally covered by the third insulating layer 120. As such, exposed surfaces of the first insulating layer 114, the second insulating layer 116 and the first spacers 118c are currently covered by the third insulating layer 120. In some embodiments, a material of the third insulating layer 120 may be identical to the material of the first spacers 118c and the first insulating layer 114, and different from the material of the second insulating layer 116. For instance, the third insulating layer 120, the first spacers 118c and the first insulating layer 114 may be made of silicon oxide, whereas the second insulating layer 116 may be made of silicon nitride. Moreover, in some embodiments, the third insulating layer 120 may be formed by a CVD process.

Figure 2H:
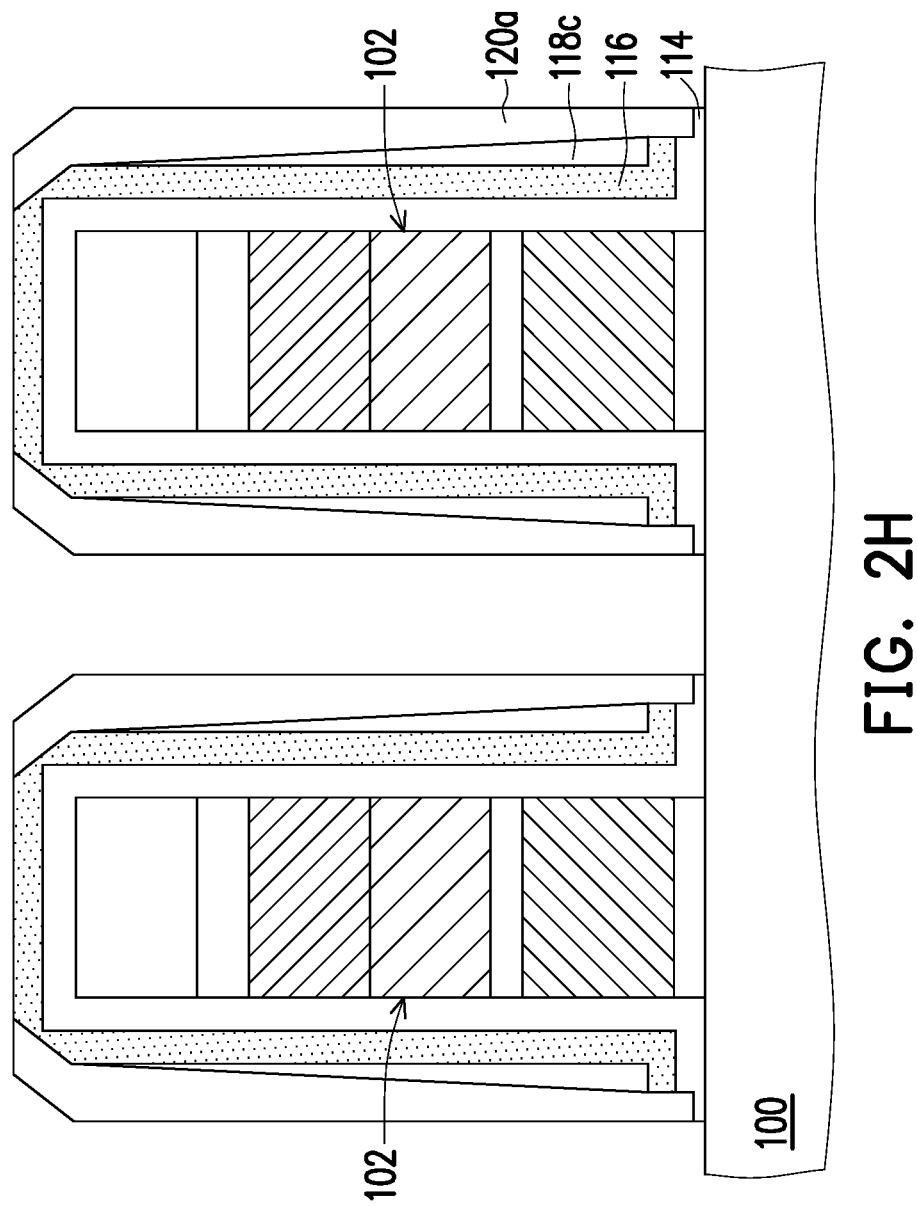
Figure 21:
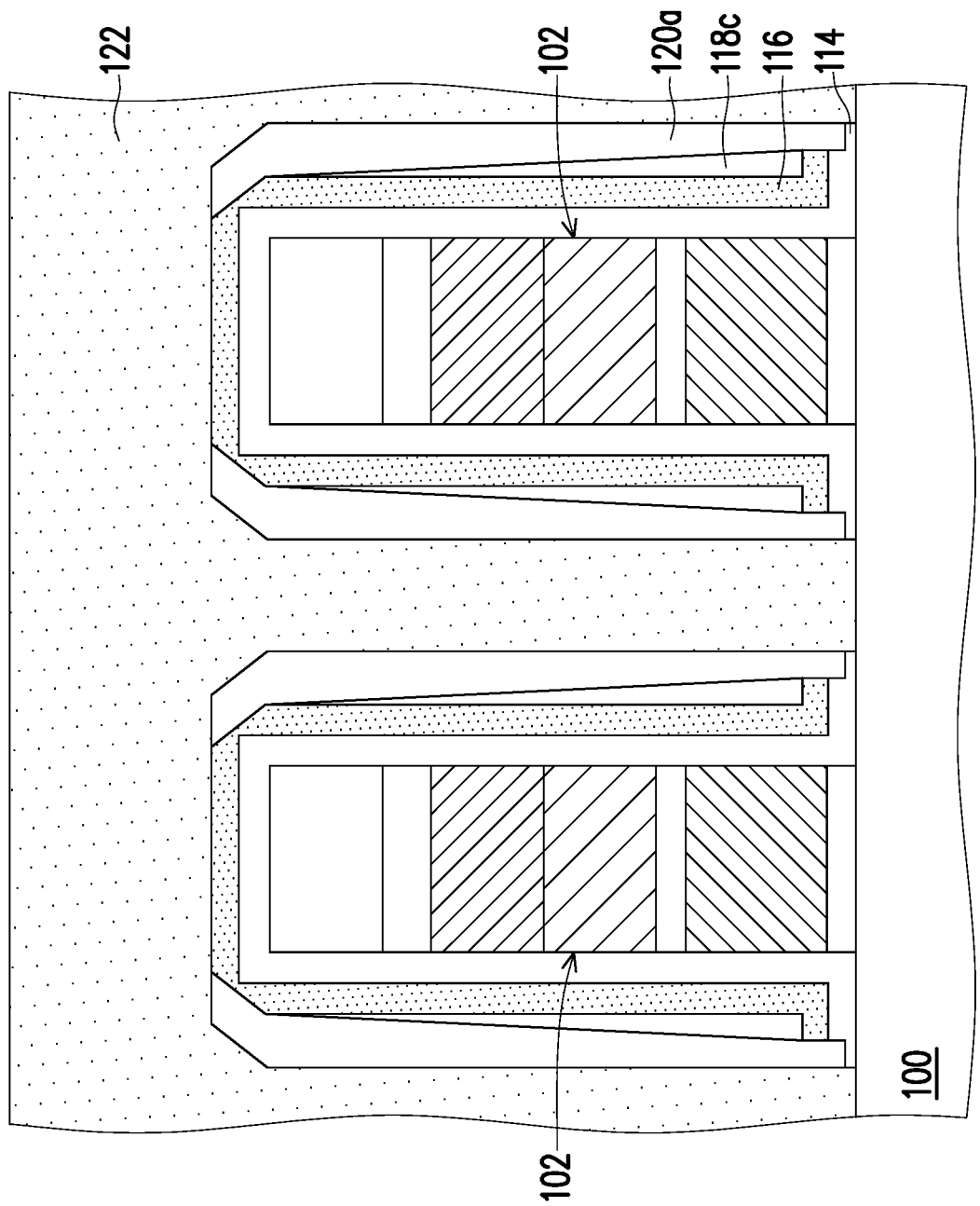

Referring to FIG. 1, FIG. 2G and FIG. 2H, step S116 is performed, and horizontal portions of the third insulating layer 120 extending on the gate stacking structures 102 and along a surface of the substrate 100 are removed. In some embodiments, the step S116 is performed by using an anisotropic etching process. During such anisotropic etching process, based on difference in arriving angle, the horizontal portions of the third insulating layer 120 can be selectively removed, whereas vertical portions of the third insulating layer 120 can be remained. As shown in FIG. 2G, the horizontal portions of the third insulating layer 120 used to cover the topmost surfaces of the second insulating layer 116 and the bottom portions of the first insulating layer 114 between adjacent first spacers 118c. After removing the horizontal portions of the third insulating layer 120, the topmost surfaces of the second insulating layer 116 can be exposed. In addition, in some embodiments, the bottom portions of the first insulating layer 114 may be removed along with the horizontal portions of the third insulating layer 120. As a result, the substrate 100 is partially exposed. In alternative embodiments, the bottom portions of the first insulating layer 114 between adjacent first spacers 118c are not removed in the current step (i.e., the step S116), but would be removed in the following step (e.g., the step S122 as shown in FIG. 2K). Hereinafter, the remained portions of the third insulating layer 120 (i.e., the vertical portions) are referred as second spacers 120a.

Referring to FIG. 1, FIG. 2H and FIG. 2I, step S118 is performed, and a conductive layer 122 is formed. In some embodiments, the conductive layer 122 is globally formed over the structure shown in FIG. 2H, and filled in the recesses between adjacent gate stacking structures 102. In this way, exposed portions of the substrate 100, the second spacers 120a and the second insulating layer 116 may be covered by the conductive layer 122. In some embodiments, the conductive layer 122 may be in contact with the exposed portions of the substrate 100. In addition, in some embodiments, a material of the conductive layer 122 may be polysilicon, and the conductive layer 122 may be formed by a CVD process.

Figure 2J:
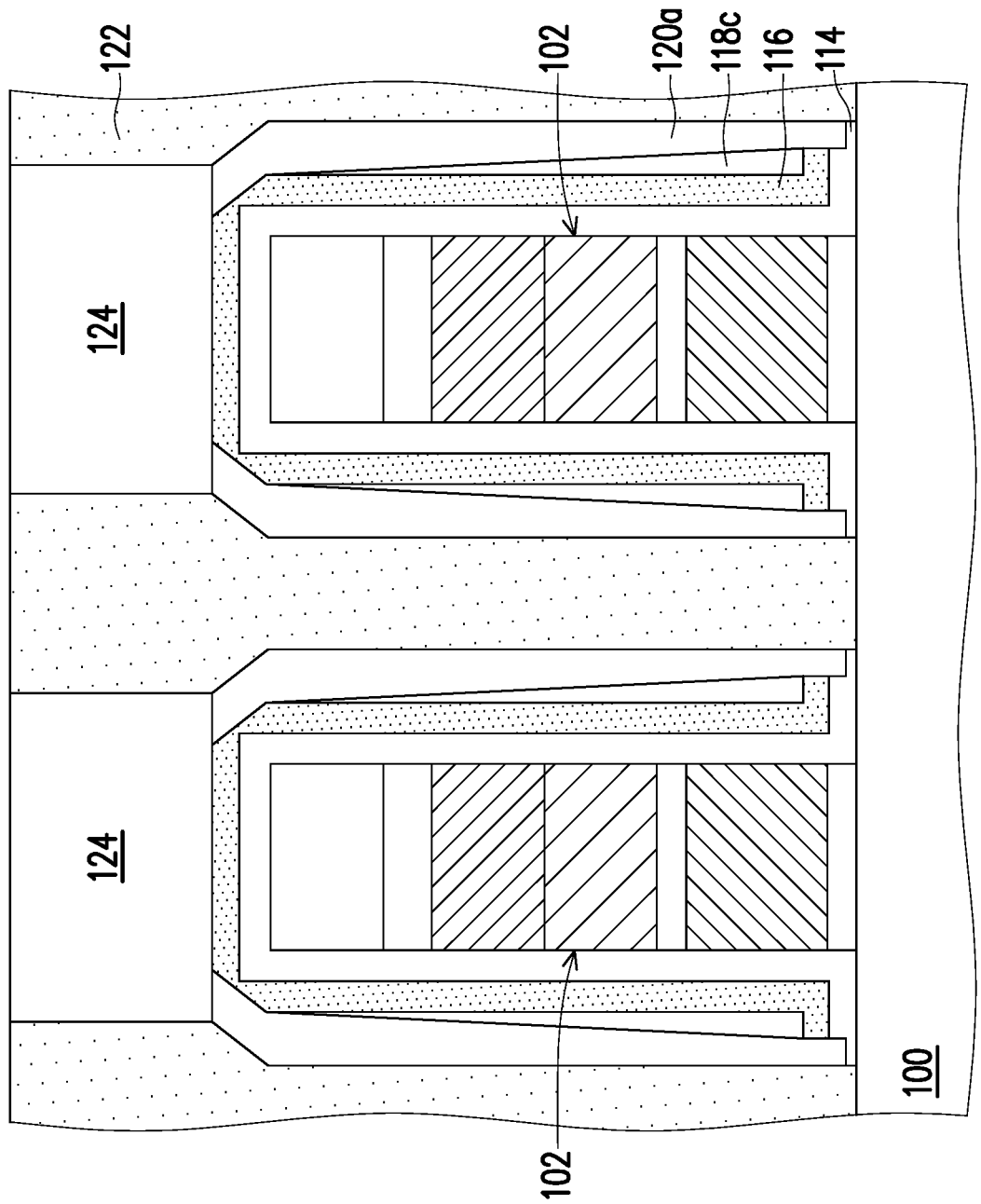
Figure 2K:
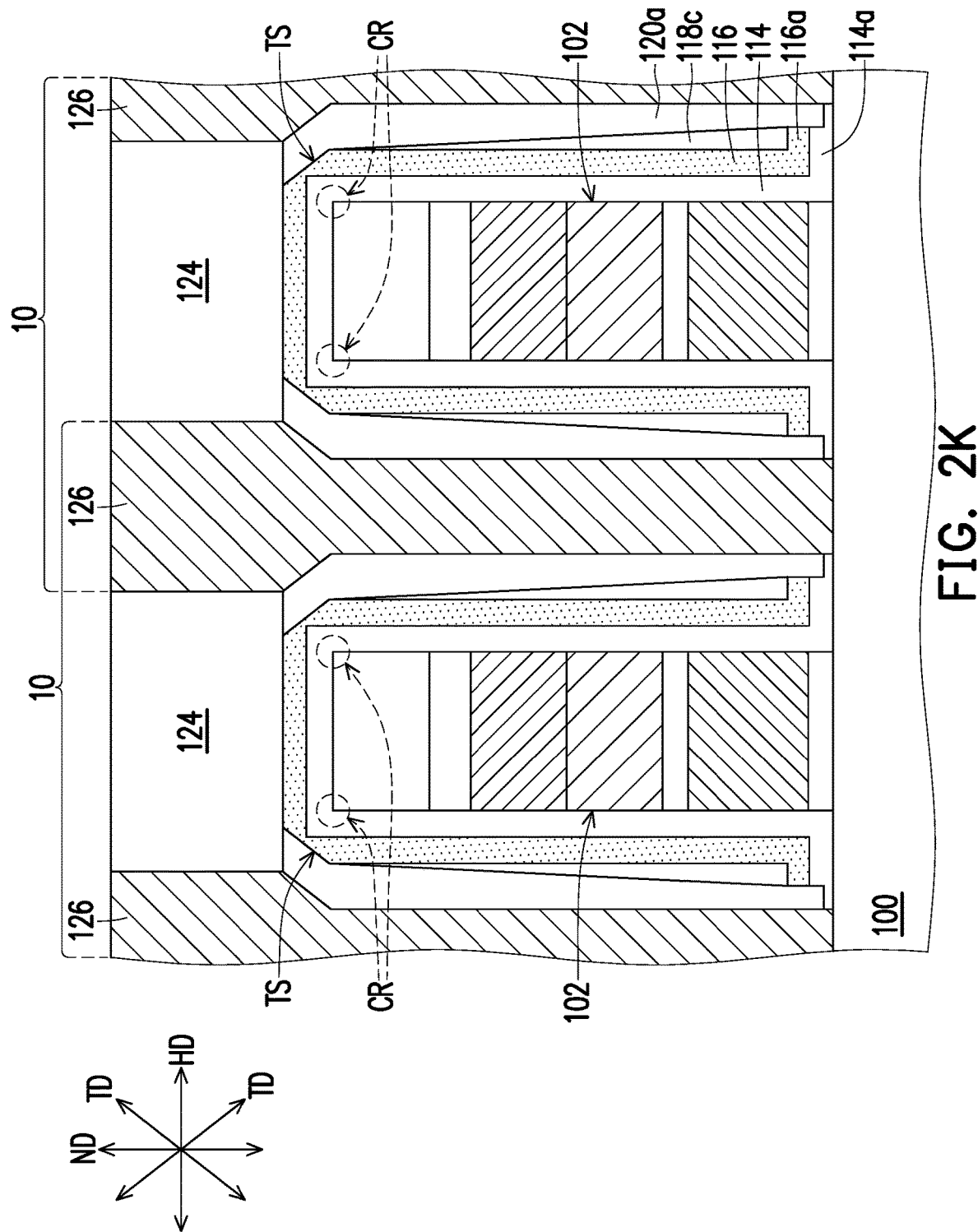

Referring to FIG. 1, FIG. 2I and FIG. 2J, step S120 is performed, and a plurality of insulating plugs 124 are formed in the conductive layer 122. The insulating plugs 124 are located above the gate stacking structures 122, and respectively overlapped with one of the gate stacking structures 102. In some embodiments, a plurality of openings respectively overlapped with one of the gate stacking structures 102 may be formed in a top portion of the conductive layer 122, then an insulating material is filled into these openings to form the insulating plugs 124. In addition, in some embodiments, these openings may expose the topmost surfaces of the second insulating layer 116 and the topmost surfaces of the second spacers 120a. As such, the subsequently formed insulating plugs 124 may cover the topmost surfaces of the second insulating layer 116 and the second spacers 120a. In some embodiments, the insulating material for forming the insulating plugs 124 may be silicon oxide, and the insulating plugs 124 (i.e., the insulating material) may be formed by a CVD process.

Referring to FIG. 1, FIG. 2J and FIG. 2K, step S122 is performed, to remove the conductive layer 122 and to form a plurality of contact structures 126. In some embodiments, the conductive layer 122 may be removed by an anisotropic etching process or an isotropic etching process. In addition, in some embodiments, a method for forming the contact structures 126 may include forming a dielectric layer (not shown) on the substrate, then forming a plurality of through holes in this dielectric layer, and filling a conductive material into these through holes to form the contact structures 126. For instance, the conductive material for forming the contact structures 126 may be W, Cu, Al or a silicon compound containing at least one of the foregoing elements, and a method for forming the contact structures 126 may include a physical vapor deposition (PVD) process, a CVD process, a plating process or combinations thereof. Each contact structure 126 may be electrically connected to one of the doped regions (not shown) in the substrate 100 and a bit line/source line located above the contact structures 126. Moreover, each gate stacking structure 102 may be located between two adjacent contact structures 126.

Up to here, manufacturing of a plurality of memory devices 10 is completed. Each memory device 10 may include one of the gate stacking structures 102 disposed over the substrate 100, and may include the first insulating layer 114, the second insulating layer 116 and the first spacer 118c covering the gate stacking structure 102. The top surface and the sidewall of the gate stacking structure 102 is covered by the first insulating layer 114, and the first insulating layer 114 is covered by the second insulating layer 116. The first spacer 118c covers the second insulating layer 116, and is located on the sidewall of the gate stacking structure 102. In addition, the topmost end of the first spacer 118c is lower than the topmost surface of the second insulating layer 116. Particularly, the top corner region CR of the gate stacking structure 102 is covered by the first insulating layer 114 and the second insulating layer 116, such that charged ions may be blocked from entering the gate stacking structure 102. Therefore, a reliability of the memory device 10 can be improved. In some embodiments, the first insulating layer 114 and the second insulating layer 116 may be made of different materials, and can block different charged ions (e.g., positively charged ions and negatively charged ions) from entering the gate stacking structure 102 via the top corner region CR of the gate stacking structure 102. For instance, the first insulating layer 114 may be made of silicon oxide, whereas the second insulating layer 116 may be made of silicon nitride.

In some embodiments, as shown in FIG. 2K, portions of the second insulating layer 116 covering the top corner regions CR of the gate stacking structures 102 have inclined surfaces TS. Extending directions TD of these inclined surfaces TS are intersected with the horizontal direction HD and a normal direction ND of the substrate 100. Furthermore, in some embodiments, the first insulating layer 114 and the second insulating layer 116 may extend outwardly to portions of the substrate 100 surrounding the gate stacking structures 102, and have bottom portions in L shapes. In these embodiments, a terminal surface of each extended portion 116a of the second insulating layer 116 may be substantially coplanar with a surface of the overlying first spacer 118c.

In some embodiments, each memory device 10 further includes the second spacer 120a. The second spacer 120a is disposed on the sidewall of the gate stacking structure 102. The second spacer 120a covers an outer surface of the first spacer 118c, and extends upwardly to cover the top corner region CR of the gate stacking structure 102. As such, the second spacer 120a may further block the charged ions from entering the gate stacking structure 102 via the top corner region CR. In some embodiments, a top surface of the second spacer 120a is substantially coplanar with the topmost surface of the second insulating layer 116. Moreover, in those embodiments where the portion of the second insulating layer 116 covering the top corner region CR of the gate stacking structure 102 has an inclined surface, a portion of the second spacer 120a covering the top corner region CR of the gate stacking structure 102 has a corresponding inclined surface. In these embodiments, an extending direction of the inclined surface of the second spacer 120a is substantially parallel to the extending direction TD of the inclined surface of the underlying second insulating layer 116. Moreover, in those embodiments where the first insulating layer 114 and the second insulating layer 116 extend outwardly from the gate stacking structure 102, the second spacer 120a may cover the terminal surface of the extended portion 116a of the second insulating layer 116. In addition, a terminal surface of an extended portion 114a of the first insulating layer 114 may be substantially coplanar with a surface of the second spacer 120a, and a region of the extended portion 114a overlapped with the second spacer 120a may have a thickness smaller than a thickness of the remainder region of the extended portion 114a.

In some embodiments, each memory device 10 further includes one of the insulating plugs 124. The insulating plug 124 is disposed over the topmost surface of the second insulating layer 116. In some embodiments, the insulating plug 124 covers the topmost surface of the second spacer 120a. In those embodiments where each memory device 10 is disposed with the insulating plug 124, the top surface of the gate stacking structure 102 may be covered by the first insulating layer 114, the second insulating layer 116 and the insulating plug 124, and the charged ions can be blocked from entering the gate stacking structure 102 from above the gate stacking structure 102.

Figure 3:
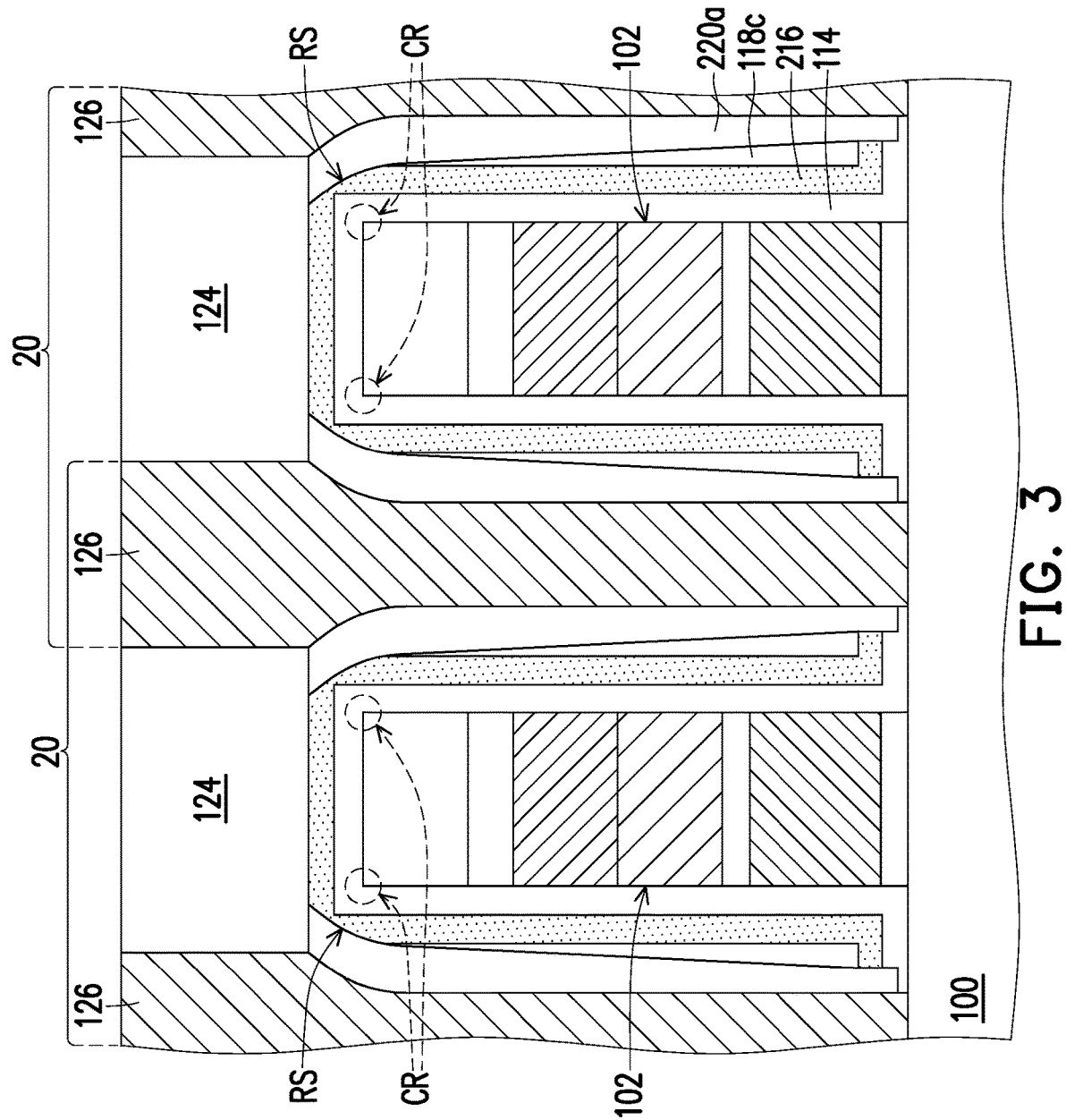
FIG. 3 is a cross-sectional view illustrating a memory device according alternative embodiments of the present disclosure.

FIG. 3 is a cross-sectional view illustrating a memory device 20 according alternative embodiments of the present disclosure. The memory device 20 as shown in FIG. 3 is similar to the memory device 10 as shown in FIG. 2K. Only difference therebetween will be described, the like or the same parts will not be repeated again.

Referring to FIG. 3, in the memory device 20, a portion of the second insulating layer 216 covering the top corner region CR of the gate stacking structure 102 has a curved surface RS. In some embodiments, the curved surface RS of the second insulating layer 216 is convex. Correspondingly, a portion of the second spacer 220a covering the corner region CR of the gate stacking structure 102 has a curved surface as well, and this curved surface is also convex.

In the embodiments as shown in FIG. 3, one or more deposition-etching cycle(s) may be performed for patterning the second insulating layer 216 (e.g., in the step S112 as shown in FIG. 2F). For instance, the patterning step including the one or more deposition-etching cycle(s) may be performed by using a high density plasma chemical vapor deposition (HDP-CVD) process. In this way, as shown in FIG. 3, the portion of the patterned second insulating layer 216 covering the top corner region CR of the gate stacking structure 102 can have the curved surface RS, and the corresponding portion of the second spacer 220a subsequently formed over the second insulating layer 216 can also have a curved surface.

As above, the memory device according to embodiments of the present disclosure includes a gate stacking structure disposed over a substrate, and includes a first insulating layer, a second insulating layer and a first spacer covering the gate stacking structure. A top surface and a sidewall of the gate stacking structure are covered by the first insulating layer, and the first insulating layer is covered by the second insulating layer. The first spacer covers the second insulating layer, and is located on a sidewall of the gate stacking structure. In addition, the topmost end of the first spacer is lower than the topmost surface of the second insulating layer. Particularly, a top corner region of the gate stacking structure is covered by the first insulating layer and the second insulating layer, such that the charged ions generated during manufacturing process can be blocked from entering the gate stacking structure. Therefore, a reliability of the memory device can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a memory device, comprising:
    forming a gate stacking structure over a substrate;
    sequentially forming a first insulating layer, a second insulating layer and a mask material layer over the substrate to cover the gate stacking structure;
    performing an ion implantation process on the mask material layer, to form a doped portion in the mask material layer, wherein the doped portion caps on a top portion of the gate stacking structure;
    performing a first patterning process on the mask material layer by using the doped portion as a shadow mask, to remove a bottom portion of the mask material layer extending along a surface of the substrate; and
    performing a second patterning process to remove the doped portion of the mask material layer and an exposed bottom portion of the second insulating layer surrounding the gate stacking structure, wherein a remained portion of the mask material layer forms a first spacer.

2. The manufacturing method of the memory device according to claim 1, further comprising performing a decoupled plasma nitridation treatment on the doped portion of the mask material layer after performing the ion implantation process on the mask material layer.

3. The manufacturing method of the memory device according to claim 1, wherein the doped portion has a first etching selectivity with respect to the second insulating layer, and has a second etching selectivity with respect to an undoped portion of the mask material layer, the first etching selectivity is less than the second etching selectivity.

4. The manufacturing method of the memory device according to claim 1, wherein the ion implantation process comprises a first oblique ion implantation process and a second oblique ion implantation process, and ions strike the mask material layer from opposite sides of the gate stacking structure during the first oblique ion implantation process and the second oblique ion implantation process.

5. The manufacturing method of the memory device according to claim 1, wherein the second patterning process includes alternately performing an etching process and a deposition process.

6. The manufacturing method of the memory device according to claim 1, further comprising:
    forming a third insulating layer on the substrate to cover the first spacer and the second insulating layer; and
    removing a horizontal portion of the third insulating layer extending over the gate stacking structure and along a surface of the substrate, wherein a remained portion of the third insulating layer forms a second spacer.

7. The manufacturing method of the memory device according to claim 1, further comprising forming an insulating plug over a topmost surface of the second insulating layer.

8. The manufacturing method of the memory device according to claim 1, wherein a material of the first insulating layer comprises silicon oxide.

9. The manufacturing method of the memory device according to claim 1, wherein a material of the second insulating layer comprises silicon nitride.

10. The manufacturing method of the memory device according to claim 1, wherein after the first spacer is formed, the second insulating layer has an extending portion extending outwardly from the sidewall of the gate stacking structure along the surface of the substrate, and a terminal surface of the extending portion is substantially coplanar with a surface of the first spacer.

11. The manufacturing method of the memory device according to claim 10, wherein the first insulating layer has an extending portion extending outwardly from the sidewall of the gate stacking structure along the surface of the substrate, and a lateral spacing from the gate stacking structure to a terminal surface of the extending portion of the first insulating layer is greater than a lateral spacing from the gate stacking structure to the terminal surface of the extending portion of the second insulating layer.

12. The manufacturing method of the memory device according to claim 1, wherein after the first spacer is formed, a portion of the second insulating layer covering a top corner region of the gate stacking structure has an inclined surface, and an extending direction of the inclined surface of the second insulating layer is intersected with a surface of the substrate and a normal direction of the substrate.

13. The manufacturing method of the memory device according to claim 1, wherein after the first spacer is formed, a portion of the second insulating layer covering a top corner region of the gate stacking structure has a curved surface.

14. The manufacturing method of the memory device according to claim 1, wherein after the first spacer is formed, the second insulating layer covers a surface of the first insulating layer on a top surface and a sidewall of the gate stacking structure.

* * * * *